United States Patent
Pandey et al.

(10) Patent No.: US 10,347,748 B2
(45) Date of Patent: Jul. 9, 2019

(54) METHODS OF FORMING SOURCE/DRAIN REGIONS ON FINFET DEVICES

(71) Applicant: GLOBALFOUNDRIES Inc., Grand Cayman (KY)

(72) Inventors: Shesh Mani Pandey, Saratoga Springs, NY (US); Muhammad Rahman, Clifton Park, NY (US); Srikanth Balaji Samavedam, Cohoes, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 135 days.

(21) Appl. No.: 15/092,168

(22) Filed: Apr. 6, 2016

(65) Prior Publication Data

US 2017/0294522 A1   Oct. 12, 2017

(51) Int. Cl.
| | | |
|---|---|---|
| *H01L 29/66* | (2006.01) | |
| *H01L 21/265* | (2006.01) | |
| *H01L 21/306* | (2006.01) | |
| *H01L 29/08* | (2006.01) | |
| *H01L 29/78* | (2006.01) | |

(52) U.S. Cl.
CPC ...... *H01L 29/66795* (2013.01); *H01L 21/265* (2013.01); *H01L 21/306* (2013.01); *H01L 29/0847* (2013.01); *H01L 29/785* (2013.01); *H01L 29/7848* (2013.01); *H01L 29/7851* (2013.01)

(58) Field of Classification Search
CPC . H01L 21/265; H01L 21/306; H01L 29/0847; H01L 29/7851; H01L 29/66795; H01L 29/66636
See application file for complete search history.

(56) References Cited

U.S. PATENT DOCUMENTS

| | | | |
|---|---|---|---|
| 2011/0220964 A1* | 9/2011 | Shin | H01L 21/30608 257/183 |
| 2013/0045589 A1* | 2/2013 | Kim | H01L 21/26506 438/478 |
| 2016/0027902 A1* | 1/2016 | Yoon | H01L 21/30608 438/198 |

* cited by examiner

*Primary Examiner* — Bilkis Jahan
*Assistant Examiner* — Victor Barzykin
(74) *Attorney, Agent, or Firm* — Amerson Law Firm, PLLC

(57) ABSTRACT

One illustrative method disclosed herein includes, among other things, forming a fin in a semiconductor substrate, forming a gate structure around the fin and, after forming the gate structure, forming a final source/drain cavity in the fin, wherein the source/drain cavity includes an upper innermost edge and a lower innermost edge, both of which extend laterally under at least a portion of the gate structure, and wherein the lower innermost edge extends laterally further under the gate structure than does the upper innermost edge. The method also includes performing an epitaxial growth process to form an epi semiconductor material in the final source/drain cavity.

23 Claims, 7 Drawing Sheets

US 10,347,748 B2

METHODS OF FORMING SOURCE/DRAIN REGIONS ON FINFET DEVICES

BACKGROUND OF THE INVENTION

1. Field of the Invention

Generally, the present disclosure relates to the manufacture of FET semiconductor devices, and, more specifically, to various methods of forming source/drain regions on FinFET devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

A conventional FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of fin-formation trenches 13, three illustrative fins 14, a gate structure 16, a sidewall spacer 18 and a gate cap layer 20. An insulating material 17 (with an upper surface 17S) provides electrical isolation between the fins 14. The gate structure 16 is typically comprised of a layer of gate insulating material (not separately shown), e.g., a layer of high-k insulating material or silicon dioxide, and one or more conductive material layers that serve as the gate electrode for the device 10. The fins 14 have a three dimensional configuration: a height H, a width W and an axial length L. The axial length L corresponds to the direction of current travel in the device 10 when it is operational, i.e., it corresponds to the gate length direction of the device. The portions of the fins 14 covered by the gate structure 16 are the channel regions of the FinFET device 10. The portions of the fins 14 that are positioned outside of the spacers 18 will become part of the source/drain regions of the device 10.

In the FinFET device 10, the gate structure 16 encloses both sides and the upper surface of the fins 14 to form a tri-gate structure so as to use a channel having a three-dimensional structure instead of a planar structure. In some cases, an insulating cap layer, e.g., silicon nitride is positioned at the top of the fins 14 and the FinFET device only has a dual-gate structure (sidewalls only). Unlike a planar FET, when an appropriate voltage is applied to the gate electrode 16 of a FinFET device 10, the surfaces (and the inner portion near the surface) of the fins 14, i.e., the vertically oriented sidewalls and the top upper surface of the fin, form a surface inversion layer or a volume inversion layer that contributes to current conduction. Also, in a FinFET device, the improved gate control through multiple gates on a narrow, fully-depleted semiconductor fin significantly reduces so-called short channel effects that occurred on planar devices with very small gate lengths. Accordingly, for a given plot space (or foot-print), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices.

The source/drain regions on N and P type transistors are doped with N-type and P-type dopant materials, respectively. These doped source/drain regions form a junction with the channel region (which may be oppositely doped or un-doped) of the device. Device designers engage in a variety of so-called junction engineering activities to improve these junction profiles in an effort to improve the overall electrical performance capabilities of the resulting FinFET devices. For example, one area of junction engineering involves forming cavities in the source/drain regions of the device and thereafter filling the cavities with an epitaxially grown semiconductor material. Another aspect of junction engineering involves trying to improve the ion implantation processing techniques that are performed to form various doped regions, e.g., source/drain extension implants, deep source/drain implants, halo implants, etc., in the FinFET device. FIGS. 1B-1E will be referenced to briefly explain some aspects of at least one prior art cavity formation process that is employed when manufacturing FinFET devices.

FIG. 1B is a cross-sectional view taken through the axial length of one of the fins 14 of the illustrative prior art FinFET semiconductor device 10 shown in FIG. 1A. The fin 14 has an overall height 14T (as measured above the bottom of the fin-formation trenches 13) and an exposed fin height 14H (as measured from the upper surface 17S of the insulating material 17). Also depicted is a shallow trench isolation region 19 that electrically isolates the finished device from adjacent devices formed on the substrate 12.

At the point of fabrication depicted in FIG. 1B, an illustrative gate structure 15 has been formed above the fin 14. The gate structure 15 is typically comprised of a layer of gate insulating material 21, e.g., a layer of high-k insulating material (k-value of 10 or greater) or silicon dioxide, a gate electrode structure 16 comprised of one or more conductive material layers (e.g., metal, metal alloy, metal stack and/or polysilicon), a gate cap 20, e.g., silicon nitride, and at least one spacer 18, e.g., silicon nitride. The spacer 18 and the gate cap 20 are provided to protect the gate electrode 16 and the gate insulation layer 21 during subsequent manufacturing processes. Although not depicted in FIG. 1B, doped regions such as source/drain extension implants and halo implant regions would have been formed in the device at this point in the fabrication process.

FIG. 1C depicts the device 10 after a first etching process 24, i.e., an anisotropic etching process, was performed to define a first cavity 26 that is substantially self-aligned with respect to the sidewall spacer 18. The depth 26D of the first cavity 26 may vary depending upon the particular application. Depending upon the particular application, the bottom of the first cavity 26 may be positioned at a level that is below or above the level of the upper surface 17S of the layer of insulating material 17.

FIG. 1D depicts the device 10 after a second etching process 28, i.e., an isotropic etching process, was performed to define a second cavity 30. Note that due to the isotropic nature of the second etching process 28, the vertical depth and lateral width of the first cavity 26 is increased. The peak depth 30D of the second cavity 30 may vary depending upon the particular application, e.g., 20-60 nm. Also note that the second cavity 30 typically extends laterally under the gate structure 15 by a distance 30L that may, in one example, be about 0.5-3 nm. In some cases, the bottom of the second cavity 30 may be positioned at a level that is below the level of the upper surface 17S of the layer of insulating material 17. In other cases, the bottom of the second cavity may be slightly above the upper surface 17S of the layer of insulating material 17.

FIG. 1E depicts the device 10 after an epitaxial growth process was performed to grow epi semiconductor material 40 in the second cavity 30. The epi semiconductor material 40 may be doped with an appropriate N or P type dopant by in situ doping of the epi semiconductor material 40 as it is being formed. Thereafter, a relatively high temperature anneal process is typically performed to activate the dopant materials and to repair any damage to the crystalline structure of the fin material due to various ion implantation processes that were performed in manufacturing the device.

Unfortunately, there are limits as to how many relatively high-temperature process operations, such as implant anneal processes, may be performed when manufacturing such devices, i.e., there is a limited thermal budget that must not be exceeded when manufacturing such devices. Thus, while ion implant engineering is a viable way to improve junction profiles, the constraint of limited thermal budgets limits the effectiveness of ion implant engineering to improve junction profiles and the electrical performance of FinFET devices.

The present disclosure is directed to various methods of forming source/drain regions on FinFET devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming source/drain regions on FinFET devices. One illustrative method disclosed herein includes, among other things, forming a fin in a semiconductor substrate, forming a gate structure around the fin and, after forming the gate structure, forming a final source/drain cavity in the fin, wherein the source/drain cavity comprises an upper innermost edge and a lower innermost edge, both of which extend laterally under at least a portion of the gate structure, and wherein the lower innermost edge extends laterally further under the gate structure than does the upper innermost edge. The method also includes performing an epitaxial growth process to form an epi semiconductor material in the final source/drain cavity.

Another illustrative method disclosed herein includes, among other things, forming a fin in a semiconductor substrate and forming a gate structure around the fin. In this example, the method also includes forming a source/drain cavity by performing a first anisotropic etching process to define a first cavity in the fin, performing a second isotropic etching process on the first cavity so as to define a second cavity in the fin, performing an amorphization implant process to form a region of amorphous fin material in the fin at a bottom of the second cavity, and performing a third isotropic etching process to remove at least a portion of the amorphous fin material and thereby define the source/drain cavity. The method also includes performing an epitaxial growth process to form an epi semiconductor material in the source/drain cavity.

One illustrative FinFET device disclosed herein includes, among other things, a fin, a gate structure positioned around a portion of the fin, and a source/drain cavity defined in the fin, wherein the source/drain cavity comprises an upper innermost edge and a lower innermost edge, both of which are positioned laterally under at least a portion of the gate structure, wherein the lower innermost edge is positioned laterally further under the gate structure than the upper innermost edge. The device also includes an epi semiconductor material positioned in the source/drain cavity.

BRIEF DESCRIPTION OF THE DRAWINGS

The disclosure may be understood by reference to the following description taken in conjunction with the accompanying drawings, in which like reference numerals identify like elements, and in which.

Figure 1A:
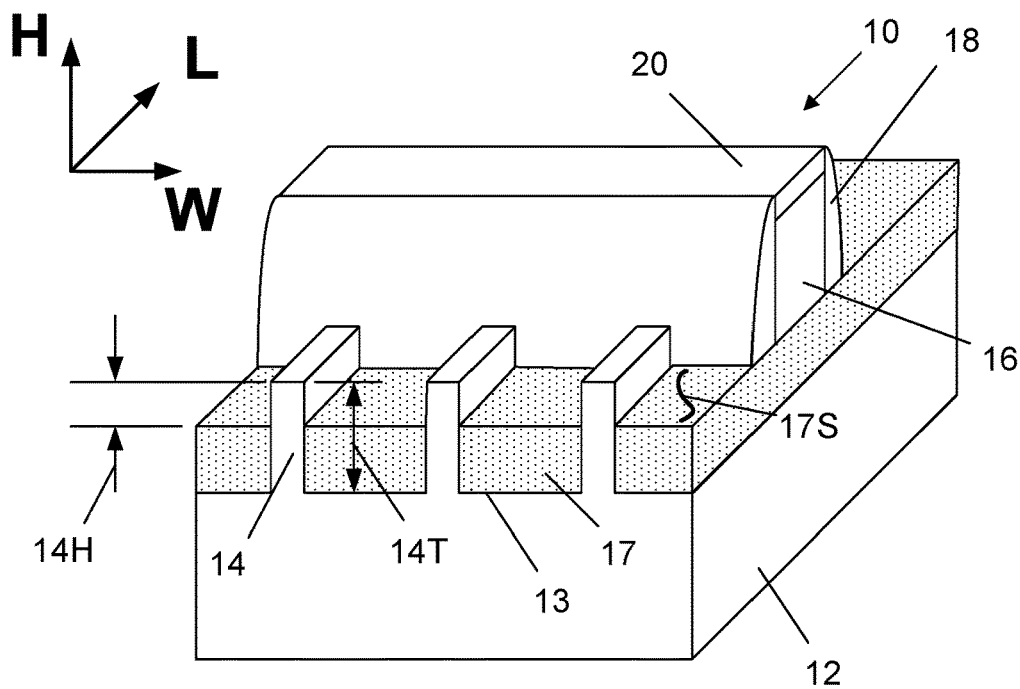
FIG. 1A depicts an example of an illustrative prior art FinFET device.
Figure 1B:
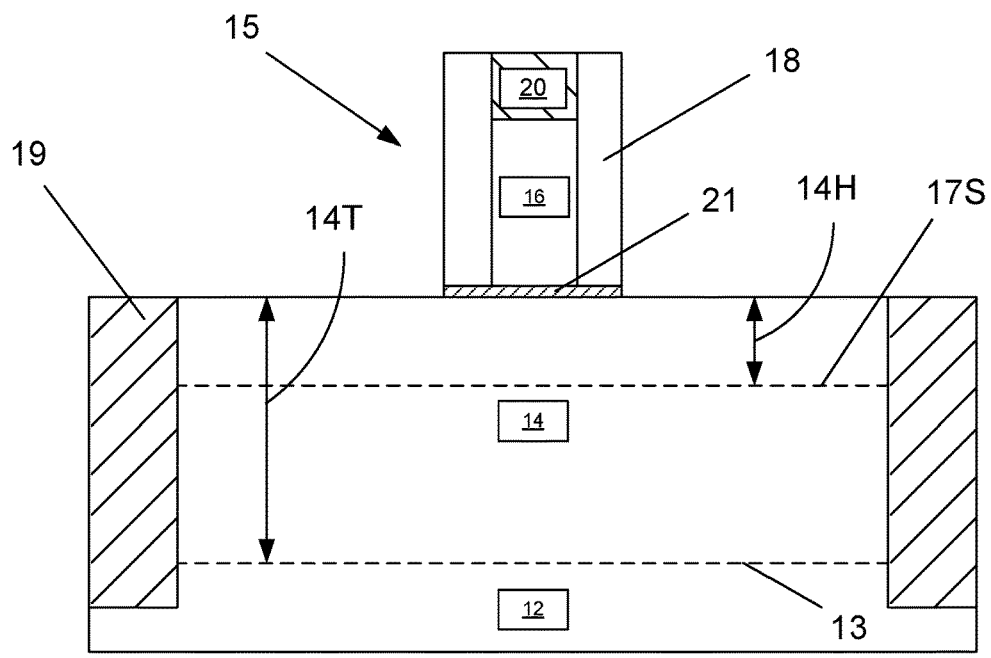
FIGS. 1B-1E depict some aspects of at least one prior art cavity formation process that is employed when manufacturing source/drain regions on FinFET devices.
Figure 1C:
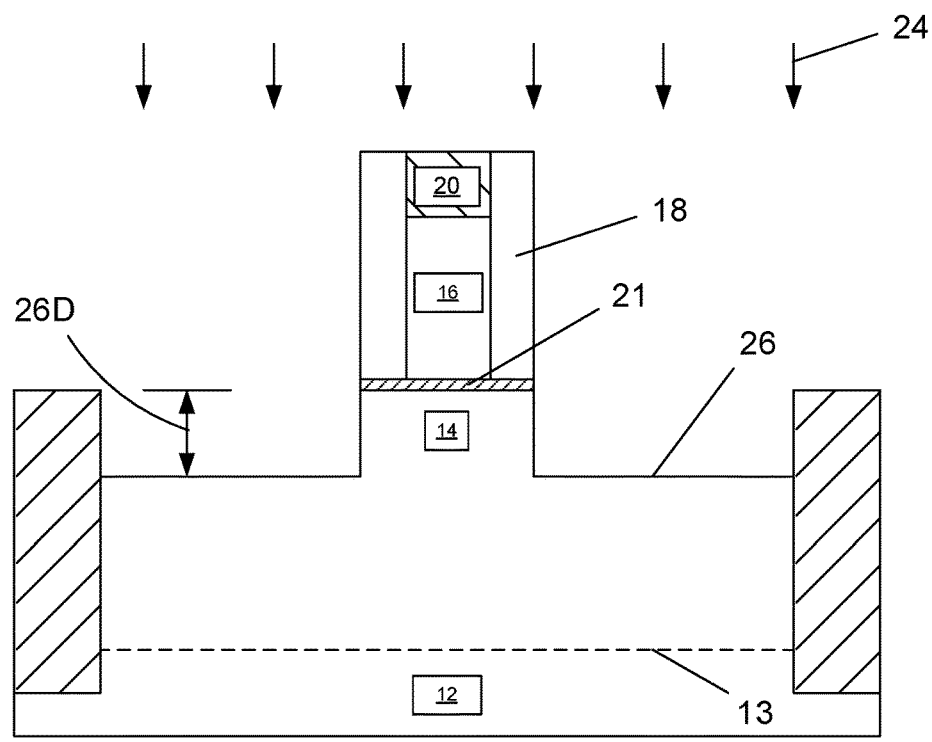
Figure 1D:
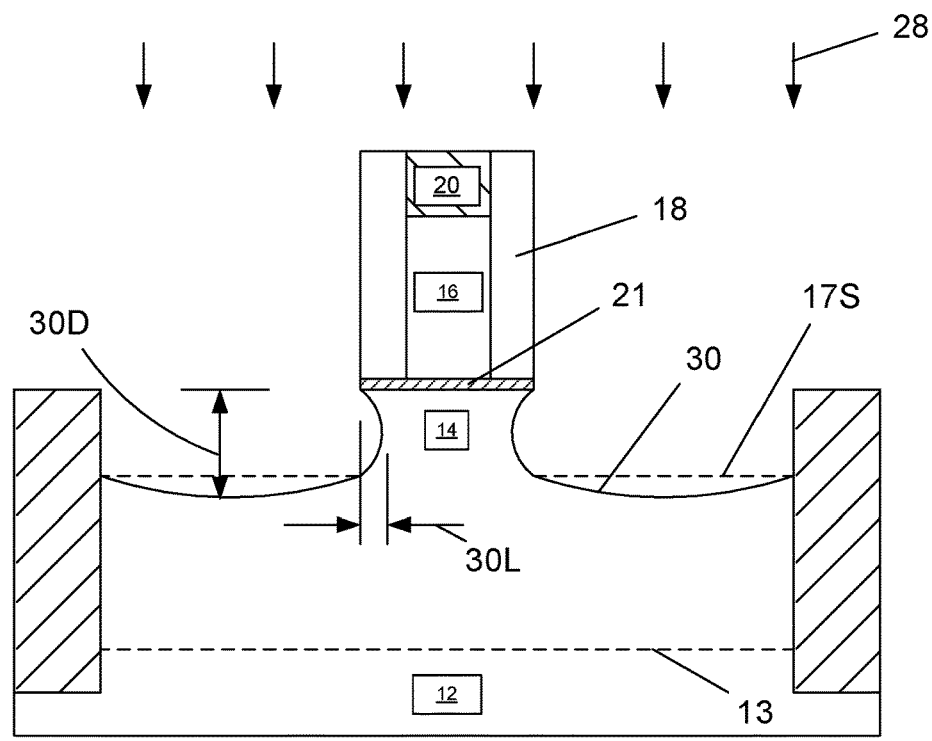
Figure 1E:
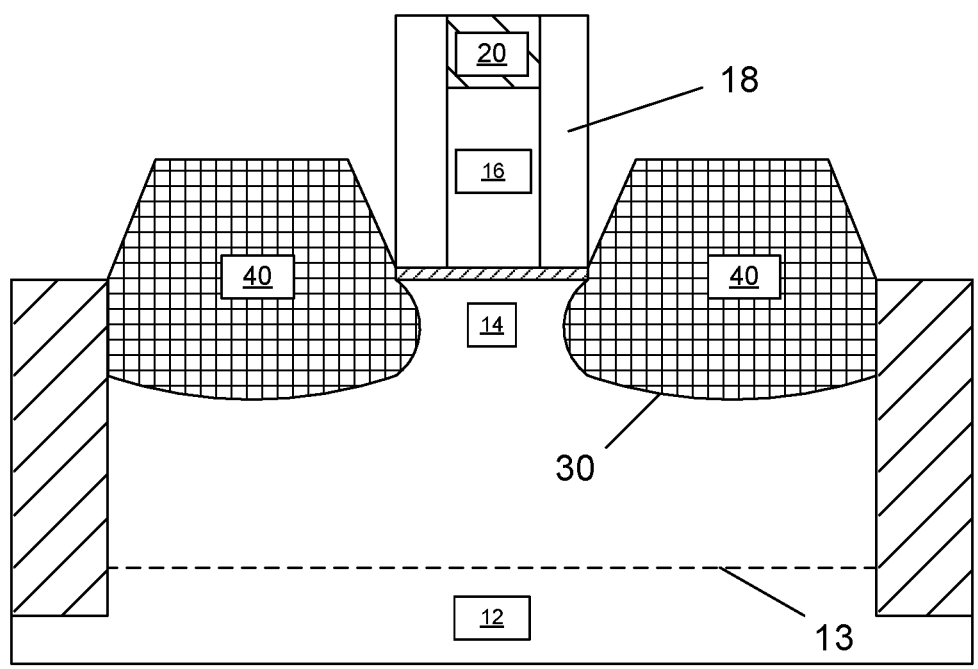

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods disclosed herein may be employed in manufacturing N-type devices and P-type devices, and the methods and devices disclosed herein may be employed in a variety of integrated circuit products, including, but not limited to, logic products, memory products, ASICs, etc. As will be appreciated by those skilled in the art after a complete reading of the present application, various doped regions, e.g., source/drain extension regions, halo implant regions, well regions and the like, are not depicted in the attached drawings. Of course, the inventions disclosed herein should not be considered to be limited to the illustrative examples depicted and described herein. The various components and structures of the illustrative FinFET device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
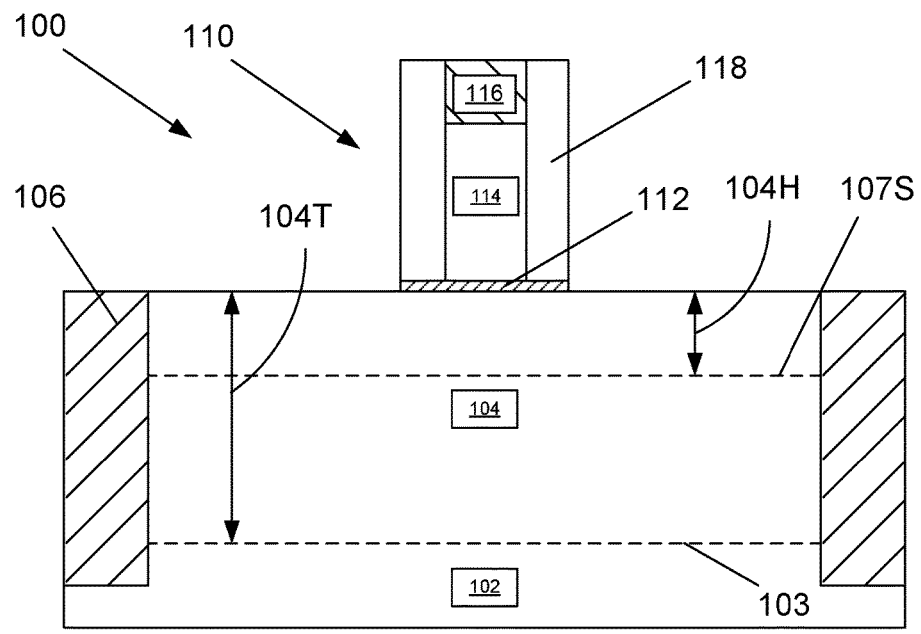
FIGS. 2A-2H depict various illustrative and novel methods disclosed herein for forming source/drain regions on FinFET devices.

FIGS. 2A-2H depict various illustrative and novel methods of forming source/drain regions on FinFET devices. With reference to FIG. 2A, the FinFET device 100 depicted herein will be formed above a semiconductor substrate 102 comprised of a semiconductor material, such as, for example, a bulk silicon substrate. The device 100 may also be formed on so-called SOI (Semiconductor-On-Insulator) substrates, wherein the material 102 would be the active layer of such an SOI substrate. Additionally, the material 102 may be comprised of any semiconductor material, e.g., silicon, silicon-germanium, germanium, a combination of so-called III-V materials, etc. Thus, the terms "substrate," "semiconductor substrate" or "semiconducting substrate" should be understood to cover all semiconductor materials in whatever physical form.

Figure 2B:
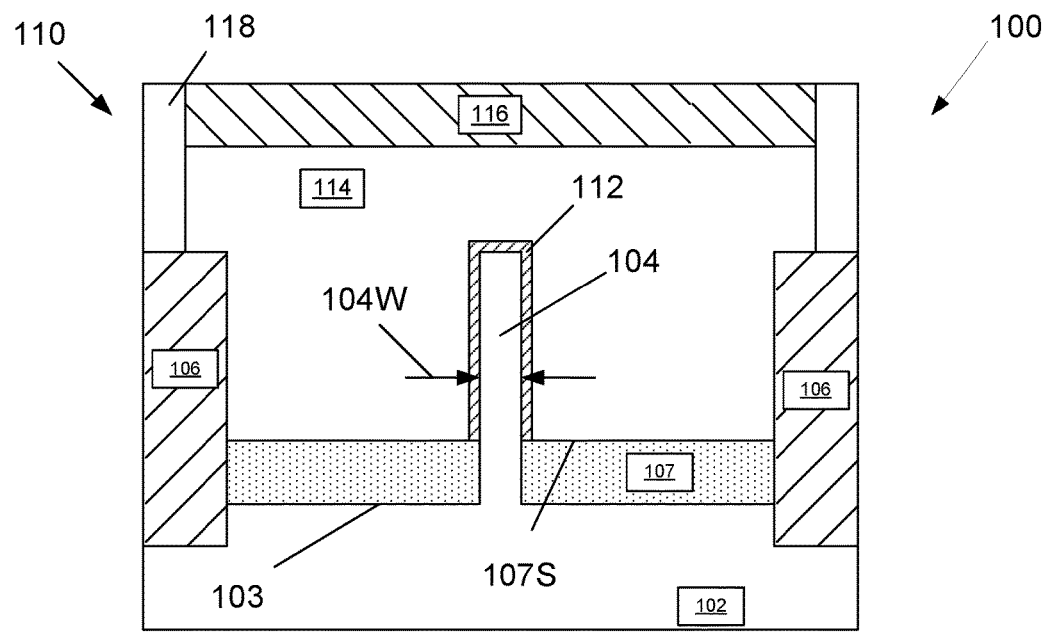

With reference to FIGS. 2A-2B, the illustrative FinFET device 100 will be depicted as being comprised of a single fin 104. FIG. 2A is a cross-sectional view taken through the axial length and vertical height of the fin 104 in a direction that corresponds to the direction of current travel in the device 100 when it is operational, i.e., the gate-length direction of the device. FIG. 2B is a cross-sectional view taken through the gate structure 110 of the device 100 in a direction that is transverse to the axial length of the fin 104, i.e., in a direction that corresponded to the gate-width of the device 100. As shown in these drawings, the fin 104 has an overall height 104T (as measured above the bottom of a plurality of fin-formation trenches 103) and an exposed fin height 104H (as measured from an upper surface 107S of a recessed layer of insulating material 107 positioned in the fin-formation trenches 103). Also depicted is a shallow trench isolation region 106 that electrically isolates the finished device 100 from adjacent devices formed on the substrate 102. The fin(s) 104 may be formed by performing one or more etching processes, e.g., anisotropic etching processes, through a patterned fin-formation etch mask (not shown) to form the fin-formation trenches 103 and thereby define one or more fins 104. The fin width 104W (see FIG. 2B), the total fin height 104T and the exposed fin height 104H may vary depending upon the particular application. Additionally, the overall size, shape and configuration of the fin-formation trenches 103 and fin 104 may vary depending on the particular application.

In the illustrative examples depicted in the attached drawings, the fin-formation trenches 103 and the fin(s) 104 are all depicted as having a uniform size and shape. However, such uniformity in the size and shape of the trenches 103 and the fin 104 is not required to practice at least some aspects of the inventions disclosed herein. In the attached figures, the fin-formation trenches 103 are depicted as having been formed by performing an anisotropic etching process that results in the fin 104 having a schematically (and simplistically) depicted, generally rectangular configuration. In an actual real-world device, the sidewalls of the fin 104 may be somewhat outwardly tapered (i.e., the fin may be wider at the bottom of the fin 104 than it is at the top of the fin 104) although that configuration is not depicted in the attached drawings. Thus, the size and configuration of the trenches 103 and the fin 104, and the manner in which they are made, should not be considered a limitation of the present invention. For ease of disclosure, only the substantially rectangular trenches 103 and fin(s) 104 will be depicted in the subsequent drawings. Moreover, the device 100 may be formed with any desired number of fins 104.

At the point of fabrication depicted in FIGS. 2A-2B, an illustrative gate structure 110 has been formed above the fin 104. The gate structure 110 is typically comprised of a layer of gate insulating material 112, e.g., a layer of high-k insulating material (k-value of 10 or greater) or silicon dioxide, a gate electrode structure 114 comprised of one or more conductive material layers (e.g., metal, metal alloy, metal stack and/or polysilicon), a gate cap 116, e.g., silicon nitride, and at least one spacer 118, e.g., silicon nitride. The spacer(s) 118 and the gate cap 116 are provided to protect the gate electrode 114 and the gate insulation layer 112 during subsequent manufacturing processes. Although not depicted in FIGS. 2A-2H, doped regions such as well regions, source/drain extension implants and halo implant regions would have been formed in the device 100 at this point in the fabrication process. The gate structure 110 of the device 100 disclosed herein may be formed using either so-called "gate-first" or "replacement gate" ("gate-last" or "gate-metal-last") manufacturing techniques.

Figure 2C:
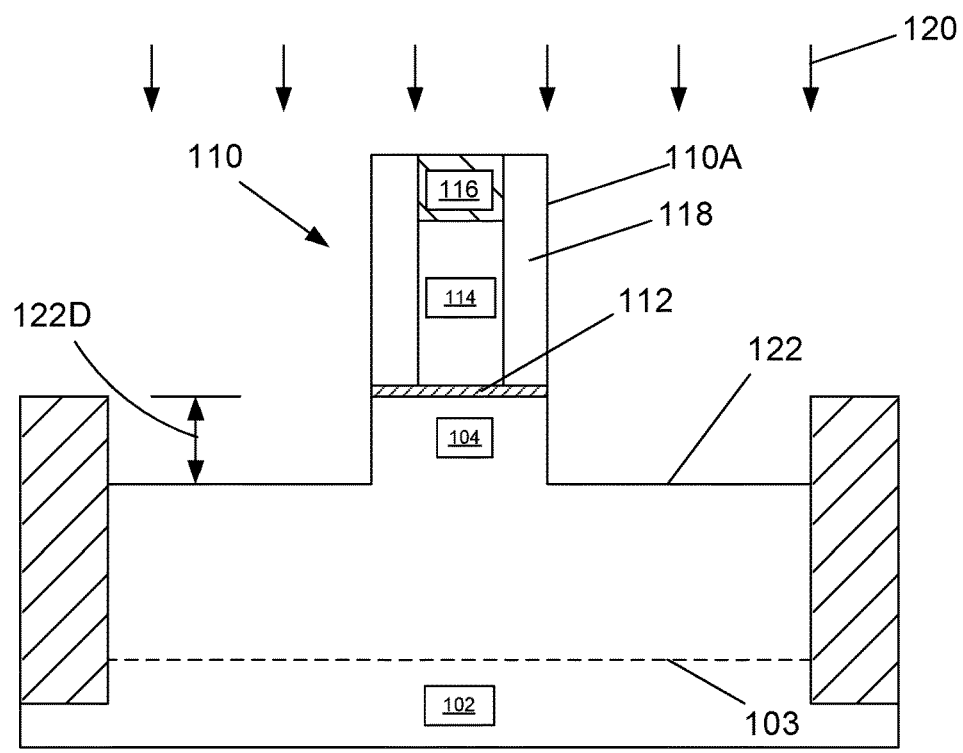

FIG. 2C depicts the device 100 after a first etching process 120, i.e., an anisotropic etching process, was performed to define a first cavity 122 in the fin 104. The first cavity 122 is substantially self-aligned with respect to the outermost edge 110A of the gate structure 110 at the time the first cavity 122 is formed, i.e., the outermost edge of the outermost sidewall spacer 118 at the time the first cavity 122 is formed. The depth 122D of the first cavity 122 may vary depending upon the particular application, e.g., 15-45 nm. Depending upon the particular application, the bottom of the first cavity 122 may be positioned at a level that is below or above the level of the upper surface 107S of the layer of insulating material 107.

Figure 2D:
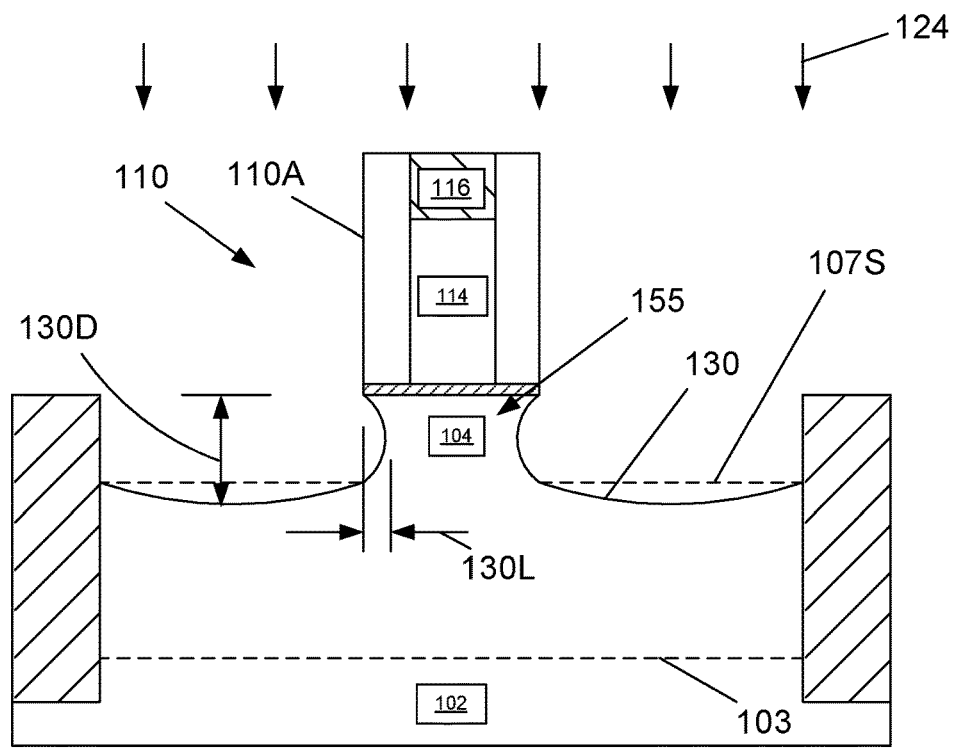

FIG. 2D depicts the device 100 after a second etching process 124, i.e., an isotropic etching process, was performed to define a second cavity 130. Note that due to the isotropic nature of the second etching process 124, the vertical depth and lateral width of the first cavity 122 is increased. The peak depth 130D of the second cavity 130 may vary depending upon the particular application, e.g., 20-50 nm. Also note that the second cavity 130 extends laterally inward toward the channel region 155, i.e., under the outermost edge 110A of the gate structure 110, by a distance 130L that may, in one example, be about 0.5-3 nm. In other applications, the distance 130L may be such that the innermost edge of the cavity 130 may be approximately vertically aligned with the edge of the gate electrode. In one embodiment, the bottom of the second cavity 130 may be positioned at a level that is below the level of the upper surface 107S of the layer of insulating material 107. In other embodiments, the bottom of the second cavity 130 may be positioned slightly above the upper surface 107S of the layer of insulating material 107. In one sense, the second cavity 130 may be considered to be an initial cavity that is formed prior to performing the processes described below.

Figure 2E:
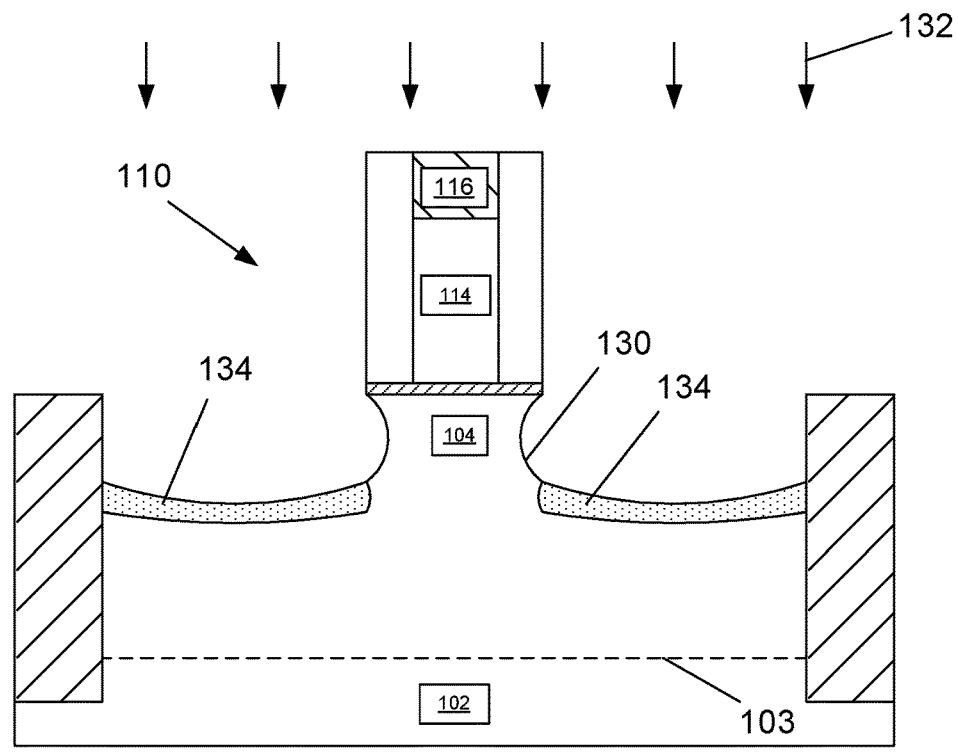

FIG. 2E depicts the device 100 after an amorphization ion implantation process 132 was performed so as to define amorphous regions 134 (e.g., amorphous silicon) of fin material within the fin 104 at the bottom of the second cavity 130. The implanted ions may spread laterally to some degree due to lateral atom straggling. In one illustrative embodiment, the amorphization ion implantation process 132 may be performed using relatively large atoms, such as xenon, antimony, argon, germanium, silicon, $GeF_2$, etc., or the like, so as to sufficiently damage the crystalline structure and order of the implanted area of the fin 104 at the bottom of the second cavity 130. In one embodiment, the amorphization ion implantation process 132 may be performed using a ion dose that falls within the range of about $1\times10^{14}$-$5\times10^{15}$ ions/cm$^2$ at an energy level that falls within the range of about 2-50 keV. The purpose of performing this amorphization ion implantation process 132 is to form the amorphous region 134 of the fin material, e.g., amorphous silicon, which may be more readily etched than the non-amorphized portions of the fin 104.

Figure 2F:
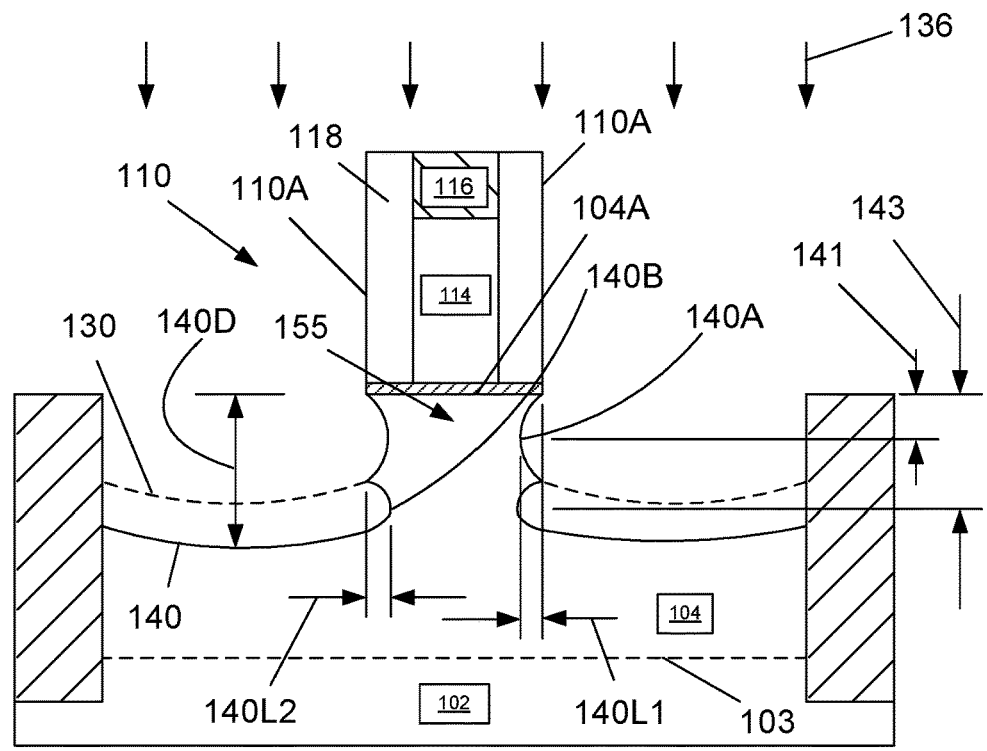

FIG. 2F depicts the device 100 after a third etching process 136, i.e., an isotropic etching process, was performed to define a third cavity 140. During the third etching process 136, the amorphous regions 134 of the fin material etch at a faster rate than does the non-amorphized regions of the fin material. Accordingly, the third final cavity 140 constitutes a unique source/drain cavity for the FinFET device 100. The final cavity 140 has an upper or first innermost edge 140A that extends into the channel region 155 and a lower or second innermost edge 140B that extends into the channel region 155 so as to define a unique stepped profile for the final cavity 140. The first innermost edge 140A and the second innermost edge 140B extend laterally inward into the channel region 115 under the gate structure 110, i.e., under at least a portion of the spacer 118. In one example, the lower or second innermost edge 140B extends further inward into the channel region 155 than does the upper or first innermost edge 140A. For example, in one illustrative embodiment, the upper or first innermost edge 140A of the final cavity 140 may extend laterally under the outermost edge 110A of the gate structure 110, i.e., under the outer edge of the outermost spacer 118, by a distance 140L1 that may, in one example, be about 0.5-3 nm. Similarly, in one illustrative embodiment, the lower or second innermost edge 140B of the final cavity 140 may extend laterally under the outermost edge 110A of the gate structure 110, i.e., under the outer edge of the outermost spacer 118, by a distance 140L2 that may, in one example, be about 1-4 nm. Stated another way, in one illustrative embodiment, the lower or second innermost edge 140B extends further inward into the channel region 155 than does the upper or first innermost edge 140A by a distance that may fall within the range of about 0.5-2 nm. Also note that, in one illustrative embodiment, the upper innermost edge 140A is located at a first level positioned a first distance 141 beneath an upper surface 104A of the fin 104 and the lower innermost edge 140B is located at a second level positioned a second distance 143 beneath the upper surface 104A of the fin 104, wherein the second distance 143 is greater than the first distance 141 by about 10-25 nm. In terms of absolute numbers, the first distance 141 and the second distance 143 may vary depending upon the particular application. In one illustrative embodiment, the first distance 141 may be about 10-25 nm, while the second distance 143 may be about 25-50 nm. Additionally, in one embodiment, the peak depth 140D of the third cavity 140 may vary depending upon the particular application, e.g., 30-60 nm. In some cases, the bottom of the final cavity 140 may be positioned at a level that is below the level of the upper surface 107S of the layer of insulating material 107. In other applications, the bottom of the cavity 140 may be positioned slightly above the upper surface 107S of the layer of insulating material 107. However, the dashed line representing the upper surface 107S was not included in FIG. 2F so as not to overly crowd the drawing.

Figure 2G:
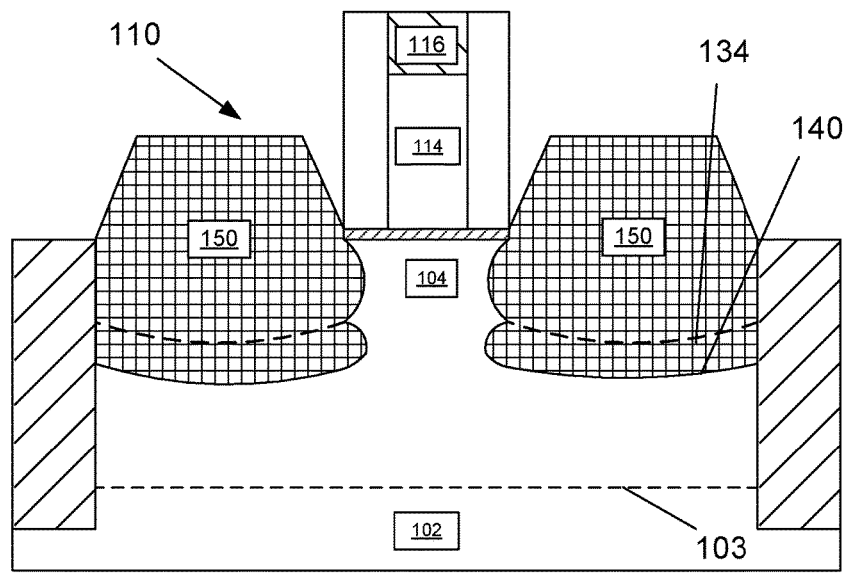

FIG. 2G depicts the device 100 after an epitaxial growth process was performed to grow epi semiconductor material 150 in the final cavity 140. The epi semiconductor material 150 may be comprised of any semiconductor material, e.g., silicon germanium for PFET devices, silicon-carbon for NFET devices, and it may be formed to any desired height above the upper surface 104A of the fin 104. The epi semiconductor material 150 may be doped with an appropriate N or P type dopant by in situ doping of the epi semiconductor material 150 as it is being formed. Thereafter, a relatively high temperature anneal process, e.g., 800-1100° C., is typically performed to activate the dopant materials and to repair any damage to the crystalline structure of the fin material due to various ion implantation processes that were performed in manufacturing the device.

Figure 2H:
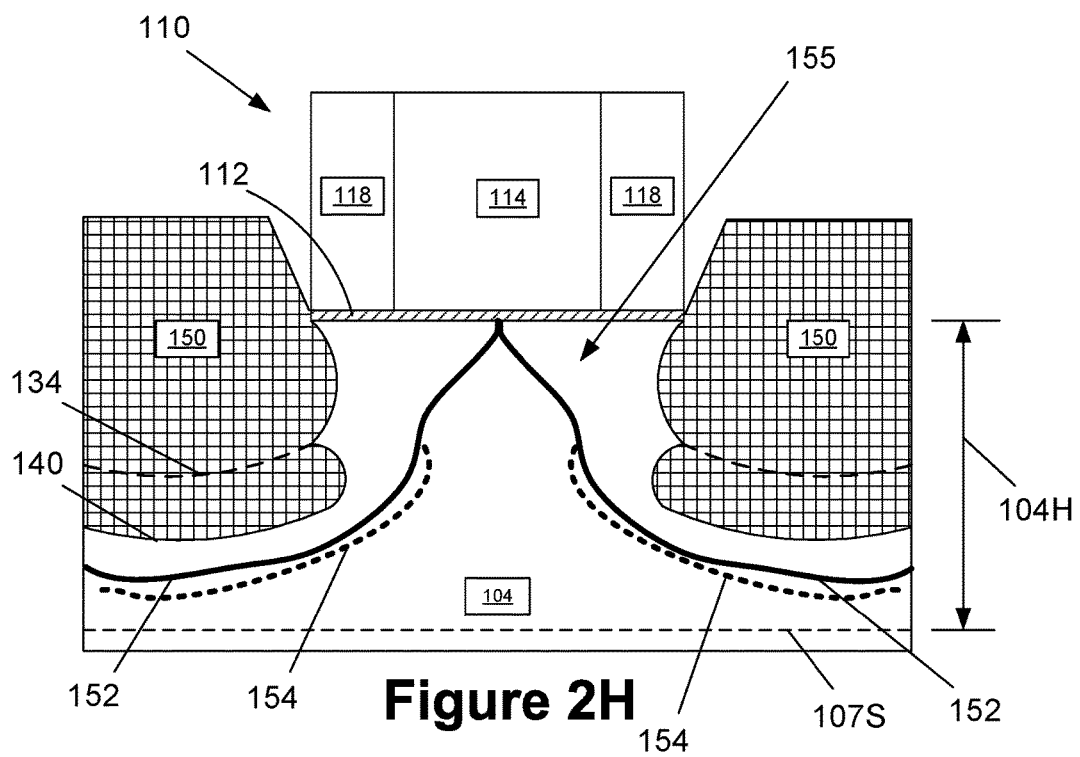

FIG. 2H is an enlarged view of the channel region 155 of the device 100. FIG. 2H depicts the results of simulations that were run which indicate that formation of the novel final cavity 140 with the stepped profile disclosed herein should increase the performance capabilities of FinFET devices as compared to the FinFET devices with source/drain cavities formed as described in the background section of this application. The solid line 152 is representative of the post-anneal junction profile that may be achieved using the prior art cavity formation process described in the background section of this application. The dashed line 154 is representative of the post-anneal junction profile that may be achieved using the novel final cavity 140 with the stepped profile as disclosed herein. In general, by forming the unique cavity 140 disclosed herein, the post-anneal junction profile 154 is positioned more laterally inward, i.e., further into the channel region 155, in the lower portion of the exposed height 104H of the fin 104, e.g., in the area corresponding to the lower or bottom third of the exposed fin height 104H, in comparison to the junction profile 152. In one example, in the lower third of the exposed height 104H of the fin 104, the novel junction profile 154 disclosed herein may be positioned about 2-5 nm more inward (depending upon the location of measurement) into the channel region 155 than that of the prior art junction profile 152. Simulations also predict that the drive current for a FinFET device formed with the unique source/drain cavity 140 depicted herein will be about 2-3 percent greater than that of a similar FinFET device with source/drain regions formed using the prior art cavity formation process discussed in the background section of this application. Additionally, simulations predict that this performance increase will apply to FinFET devices having various threshold voltages, e.g., super-low Vt devices, regular Vt devices, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a source/drain region on a FinFET device, comprising:
    forming a plurality of fin-formation recesses to define a fin in a semiconductor substrate;
    forming a layer of insulating material in said plurality of fin-formation recesses;
    forming a gate structure around said fin;
    after forming said gate structure, forming a final source/drain cavity in said fin, said final source/drain cavity comprising an upper innermost edge and a lower innermost edge, both of which extend laterally under at least a portion of said gate structure, wherein said lower innermost edge extends laterally further under said gate structure than does said upper innermost edge, and wherein a height level of a bottom of said final source/drain cavity is below a height level of an upper surface of said layer of insulating material relative to an upper surface of said fin; and
    after forming said final source/drain cavity, performing an epitaxial growth process to form an epi semiconductor material in said final source/drain cavity.

2. The method of claim 1, wherein forming said final source/drain cavity in said fin comprises:
    performing at least one etching process to define an initial cavity in said fin;
    performing an amorphization implant process to form a region of amorphous fin material in said fin at a bottom of said initial cavity; and
    performing an isotropic etching process to remove at least a portion of said amorphous fin material and thereby define said final source/drain cavity.

3. The method of claim 1, wherein forming said gate structure comprises forming a gate insulation layer, a gate electrode, a gate cap and at least one sidewall spacer.

4. The method of claim 1, wherein forming said final source/drain cavity in said fin comprises:
    performing a first anisotropic etching process to define a first cavity in said fin;
    performing a second isotropic etching process on said first cavity so as to define a second cavity in said fin;
    performing an amorphization implant process to form a region of amorphous fin material in said fin at a bottom of said second cavity; and
    performing a third isotropic etching process to remove at least a portion of said amorphous fin material and thereby define said final source/drain cavity.

5. The method of claim 4, wherein said first cavity is substantially self-aligned with an outermost edge of said gate structure.

6. The method of claim 5, wherein performing said second isotropic etching process comprises performing said second isotropic etching process so as to define said second cavity having a first peak depth.

7. The method of claim 6, wherein performing said third isotropic etching process comprises performing said third isotropic etching process to define said final source/drain cavity having a second peak depth that is greater than said first peak depth.

8. The method of claim 1, wherein said epi semiconductor material comprises one of silicon, silicon-germanium, silicon carbon, or germanium.

9. The method of claim 2, wherein performing said amorphization implant process comprises performing said amorphization implant process using an ion dose that falls within a range of about $1 \times 10^{14}$-$5 \times 10^{15}$ ions/cm$^2$ at an energy level that falls within a range of about 2-50 keV.

10. The method of claim 9, wherein said amorphization implant process is performed using one of xenon, antimony, argon, germanium, silicon, or GeF$_2$.

11. The method of claim 1, wherein said upper innermost edge is located at a first level positioned a first distance beneath an upper surface of said fin and said lower innermost edge is located at a second level positioned a second distance beneath said upper surface of said fin, said second distance being greater than said first distance.

12. The method of claim 2, wherein, after performing said at least one etching process, a height level of a bottom of said initial cavity is below said height level of said upper surface of said layer of insulating material relative to said upper surface of said fin.

13. The method of claim 2, wherein, after performing said at least one etching process, a height level of a bottom of said initial cavity is above said height level of said upper surface of said layer of insulating material relative to said upper surface of said fin.

14. The method of claim 4, wherein, after performing said second isotropic etching process, a height level of a bottom of said second cavity is below said height level of said upper surface of said layer of insulating material relative to said upper surface of said fin.

15. The method of claim 4, wherein, after performing said second isotropic etching process, a height level of a bottom of said second cavity is above said height level of said upper surface of said layer of insulating material relative to said upper surface of said fin.

16. A method of forming a source/drain region on a FinFET device, comprising:
   forming a plurality of fin-formation recesses to define a fin in a semiconductor substrate;
   forming a layer of insulating material in said plurality of fin-formation recesses;
   forming a gate structure around said fin;
   after forming said gate structure, forming a source/drain cavity by:
      performing a first anisotropic etching process to define a first cavity in said fin;
      performing a second isotropic etching process on said first cavity so as to define a second cavity in said fin;
      performing an amorphization implant process to form a region of amorphous fin material in said fin at a bottom of said second cavity; and
      performing a third isotropic etching process to remove at least a portion of said amorphous fin material and thereby define said source/drain cavity, wherein, after performing said third isotropic etching process, a height level of a bottom of said source/drain cavity is below a height level of an upper surface of said layer of insulating material relative to an upper surface of said fin; and
   performing an epitaxial growth process to form an epi semiconductor material in said source/drain cavity.

17. The method of claim 16, wherein said first cavity is substantially self-aligned with an outermost edge of said gate structure.

18. The method of claim 16, wherein performing said second isotropic etching process comprises performing said second isotropic etching process so as to define a second cavity having a first peak depth and a first innermost edge, said first innermost edge extending under at least a portion of said gate structure.

19. The method of claim 18, wherein performing said third isotropic etching process comprises performing said third isotropic etching process to define a source/drain cavity comprising a second peak depth and a second innermost edge for said source/drain cavity, wherein said second innermost edge extends under at least a portion of said gate structure for a greater distance than does said first innermost edge and said second peak depth is greater than said first peak depth.

20. The method of claim 19, wherein said first innermost edge is located at a first level positioned a first distance beneath an upper surface of said fin and said second innermost edge is located at a second level positioned a second distance beneath said upper surface of said fin, said second distance being greater than said first distance.

21. The method of claim 16, wherein performing said amorphization implant process comprises performing said amorphization implant process using an ion dose that falls within a range of about $1 \times 10^{14}$-$5 \times 10^{15}$ ions/cm$^2$ at an energy level that falls within a range of about 2-50 keV.

22. The method of claim 16, wherein, after performing said second isotropic etching process, a height level of a bottom of said second cavity is below said height level of said upper surface of said layer of insulating material relative to said upper surface of said fin.

23. The method of claim 16, wherein, after performing said second isotropic etching process, a height level of a bottom of said second cavity is above said height level of said upper surface of said layer of insulating material relative to said upper surface of said fin.

* * * * *